United States Patent [19]
Watanabe

[11] Patent Number: 6,089,630
[45] Date of Patent: Jul. 18, 2000

[54] SUBSTRATE TRANSFER APPARATUS

[75] Inventor: Hayao Watanabe, Gunma, Japan

[73] Assignee: NSK Ltd., Tokyo, Japan

[21] Appl. No.: 09/220,850

[22] Filed: Dec. 28, 1998

[30] Foreign Application Priority Data

Dec. 27, 1997 [JP] Japan ................................. 9-367642

[51] Int. Cl.[7] ............................ H01L 21/68; B25J 18/00; B25J 19/00
[52] U.S. Cl. ........................... 294/1.1; 414/744.5; 901/27
[58] Field of Search ............................ 294/1.1, 32, 86.4; 414/935, 941, 744.5; 901/27, 15, 50; 74/490.01, 479.01

[56] References Cited

U.S. PATENT DOCUMENTS

| | | | |
|---|---|---|---|
| 4,584,045 | 4/1986 | Richards | 414/744.5 |
| 5,489,192 | 2/1996 | Taniguchi | 414/744.2 |
| 5,584,647 | 12/1996 | Uehara et al. | 414/744.5 |
| 5,700,046 | 12/1997 | Doren et al. | 414/941 |
| 5,702,228 | 12/1997 | Tamai et al. | 414/935 |
| 5,733,096 | 3/1998 | Doren et al. | 414/744.5 |
| 5,934,856 | 8/1999 | Asakawa et al. | 414/744.5 |
| 5,950,495 | 9/1999 | Orgawa et al. | 414/941 |

FOREIGN PATENT DOCUMENTS

| | | | |
|---|---|---|---|
| 63-2688 | 1/1988 | Japan | B25J 18/00 |
| 401305533 | 12/1989 | Japan | 414/941 |
| 3-295226 | 12/1991 | Japan | H01L 21/22 |
| 404116845 | 4/1992 | Japan | 414/941 |
| 405243363 | 9/1993 | Japan | 414/941 |

*Primary Examiner*—Dean J. Kramer
*Assistant Examiner*—Paul T. Chin
*Attorney, Agent, or Firm*—Sughrue, Mion, Zinn, Macpeak & Seas, PLLC

[57] ABSTRACT

A arm 4 or 104 comprises a heat conduction suppressing portion such as cut-out grooves 8 or a low-temperature melting substance which suppresses conduction of heat. The heat conduction suppressing portion is disposed between a tip end portion of a front end arm 4 or 104 coupled to a mounting member 5 for a wafer W, and a basal portion of the front end arm 4 or 104. The substrate transfer apparatus according to the present invention can accurately transfer a substrate such as a semiconductor wafer for a long term while suppressing an influence of heat from a film growth apparatus or the like, to a level as low as possible.

16 Claims, 11 Drawing Sheets

SUBSTRATE TRANSFER APPARATUS

BACKGROUND OF THE INVENTION

The present invention relates to a substrate transfer apparatus, and more particularly to a substrate transfer apparatus which can accurately transfer a substrate such as a semiconductor wafer for a long term while suppressing an influence of heat from a film growth apparatus or the like, to a level as low as possible.

In a semiconductor production step, a film growing process such as CVD (Chemical Vapor Deposition) or sputtering is performed in order to form an integrated circuit on a semiconductor wafer (hereinafter, referred to as "wafer") made of silicon or the like. In such a film growing process, a given processing gas and the like are supplied into a vacuum vessel which is evacuated and heated to a given high temperature, a wafer is transferred into the vessel by a transfer apparatus, and a film of a predetermined material such as a metal is then grown on the wafer. After the film growing process, the wafer is carried out by the transfer apparatus to be transferred to the subsequent step or the like.

Figure 14:
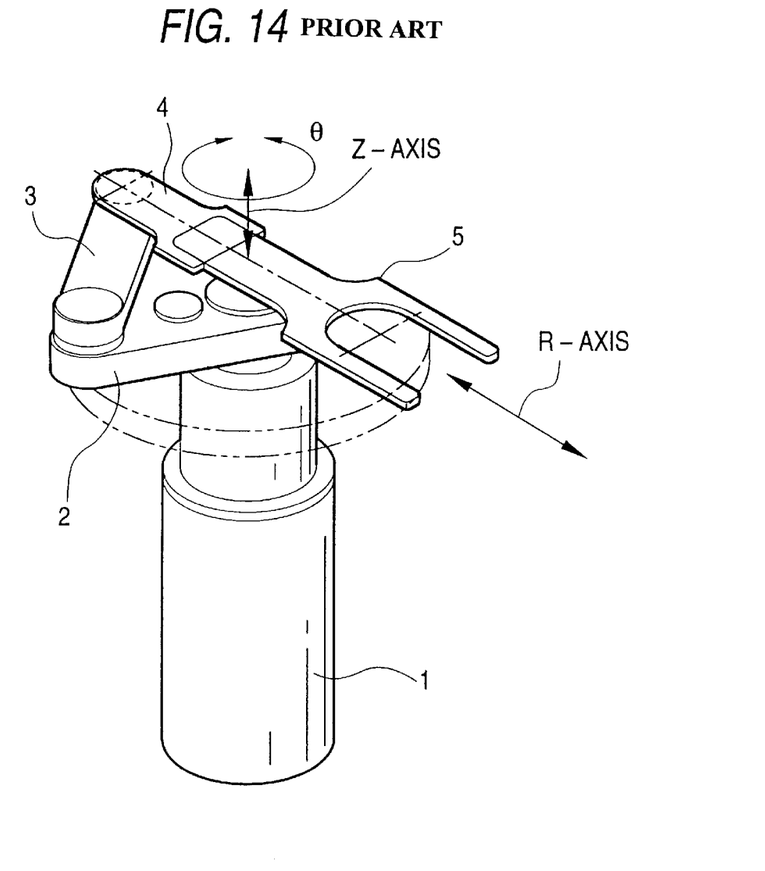
FIG. 14 is a perspective view of a wafer transfer apparatus.

In such a wafer transfer apparatus, as shown in FIG. 14, a first arm 2, a second arm 3, and a third arm 4 are rotatably coupled in sequence to an upper portion of a driving mechanism 1. An end effector 5 on which a wafer is to be placed is disposed at the tip end of the third arm 4. In order to reduce the contact area with a wafer, the tip end of the end effector 5 is fork-shaped, and the end effector is made of ceramics for the sake of prevention of contamination, insulation, and the like. When the first to third arms 2 to 4 are elevated in the direction Z by driving of the driving mechanism 1, the end effector 5 is elevated in the direction Z, and, when the first to third arms 2 to 4 are rotated, the end effector 5 is rotated in the direction θ and moved in the R-axis.

Figure 15:
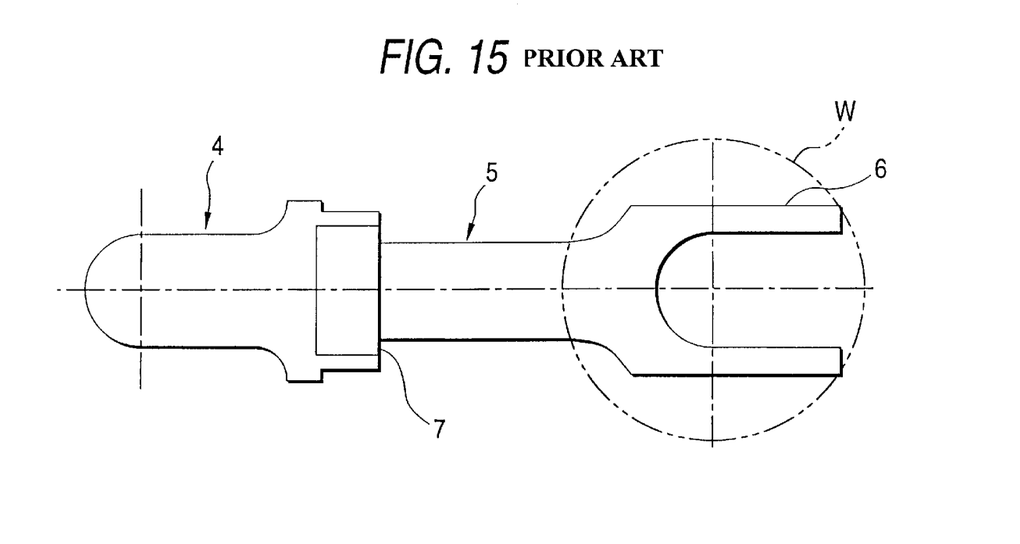
FIG. 15 is a plan view of a mounting member and an arm of the wafer transfer apparatus of the prior art.

As shown in FIG. 15, the end effector 5 has a fork-like portion 6 on which a wafer W is to be placed, and is made of ceramics as described above. The basal portion of the end effector 5 is fittingly fixed to a fitting portion 7 which is formed in the tip end of the third arm 4. The third arm 4 is made of aluminum for the sake of prevention of contamination and the like.

In such a film growth apparatus for CVD, the wafer W is always exposed to a high temperature during a film growing process. This high temperature is transmitted from the wafer W to the third arm 4 made of aluminum which is excellent in thermal conductivity, via the end effector 5 on which the wafer W is placed, and further transmitted from the third arm 4 to the second arm 3, the first arm 2, and the driving mechanism 1. As a result, the transfer apparatus is affected by heat from the film growth apparatus.

When a transfer apparatus is affected by heat from a film growth apparatus as described above, a magnetic fluid used in the transfer apparatus may be changed in quality and the sealing performance of a magnetic fluid seal may be impaired. Furthermore, grease or a belt in the transfer apparatus may be changed in quality or deformed, so that the life period of the grease or the belt is shortened. Moreover, heat of a relatively high temperature may be transmitted to a metal part of the transfer apparatus, and the metal part is thermally expanded, so that the accuracy of the part is lowered.

SUMMARY OF THE INVENTION

The invention has been performed in view of the above-discussed circumstances. It is an object of the invention to provide a substrate transfer apparatus which can accurately transfer a substrate such as a semiconductor wafer for a long term while suppressing an influence of heat from a film growth apparatus or the like, to a level as low as possible.

The object can be attained by a substrate transfer apparatus comprising:

a driving mechanism;

a plurality of arms rotatably coupled in sequence to the driving mechanism, the arms including a first arm which comprises a heat conduction suppressing portion disposed between a tip end portion and a basal portion thereof; and a placing member coupled to the first arm for placing a substrate thereon.

According to the invention, a heat conduction suppressing portion which suppresses conduction of heat is disposed between the end portion of the first arm coupled to the mounting member, and the basal portion of the first arm. Even when the mounting member for a substrate is exposed to a relatively high temperature of a film growth apparatus or the like, the heat conduction to another arms of the transfer apparatus, the driving mechanism, and the like is suppressed, and an influence of heat from a film growth apparatus or the like is reduced. Therefore, a magnetic fluid used in the transfer apparatus is less changed in quality, and deterioration of the sealing performance of the magnetic fluid seal is reduced. Furthermore, grease or a belt in the transfer apparatus is less changed in quality or deformed, so that the life period of the grease or the belt is prolonged, whereby the number of maintenance works can be reduced. Moreover, heat of a high temperature is hardly transmitted also to a metal part of the transfer apparatus, and hence the metal part is thermally expanded in a reduced degree, so that the accuracy of the part is stabilized. Therefore, a substrate such as a semiconductor wafer can be accurately transferred for a long term while suppressing an influence of heat from the film growth apparatus or the like, to a level as low as possible.

BRIEF DESCRIPTION OF THE DRAWINGS

FIG. 12(a) and FIG. 12(b) are enlarged views of the portion A of FIG. 11, FIG. 12(a) shows the state before an electromagnet is energized, and FIG. 12(b) the state after the electromagnet is energized;

DETAILED DESCRIPTION OF THE PREFERRED EMBODIMENTS

Hereinafter, wafer transfer apparatuses of embodiments of the invention will be described with reference to the accompanying drawings.

In the wafer transfer apparatuses of the embodiments of the invention, the portions of other than those which will be described are configured in the same manner as those of the wafer transfer apparatus shown in FIGS. 14 and 15.

Figure 1:
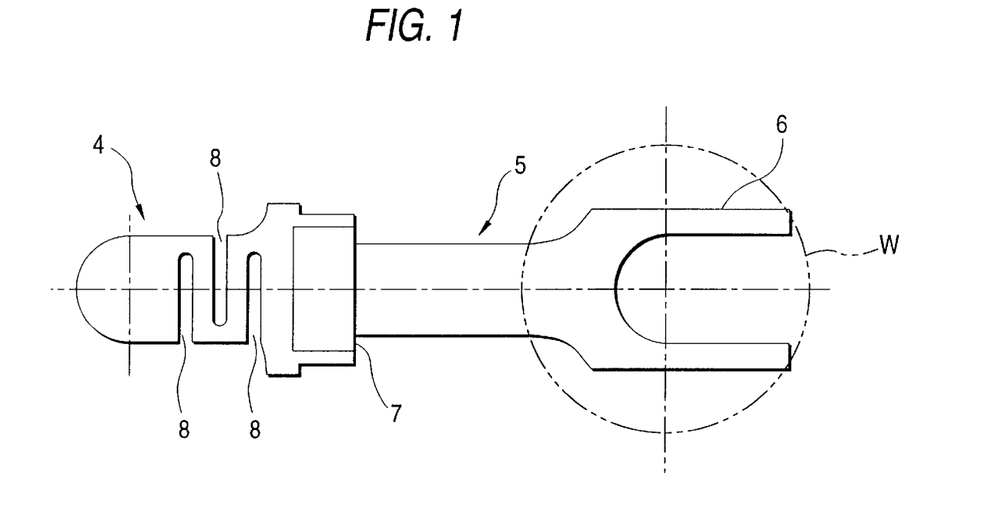
FIG. 1 is a plan view of a mounting member and an arm of a wafer transfer apparatus of a first embodiment of the invention.

FIG. 1 is a plan view of a mounting member and an arm of a wafer transfer apparatus of a first embodiment of the invention. The end effector 5 (mounting member) has the fork-like portion 6 on which a wafer W,(substrate) is to be placed. The basal portion of the end effector 5 is fittingly fixed to the fitting portion 7 which is formed in the tip end of the third arm 4 (front end arm).

In the embodiment, three cut-out grooves 8 are formed in a staggered manner between the tip end portion and the basal portion of the third arm 4. The portion formed among the cut-out grooves 8 constitutes a heat conduction path. The portion is formed by the cut-out grooves 8 so as to have a relatively large length. Even when heat is transmitted from the side of the end effector 5, therefore, the heat is naturally radiated in the course of transmission of heat in the portion among the cut-out grooves 8. In the embodiment, the portion among the cut-out grooves 8 constitutes the heat conduction suppressing portion which suppresses conduction of heat.

In the first embodiment and the following embodiments, the shape and number of the cut-out grooves are not restricted to those of the embodiments.

Figure 2:
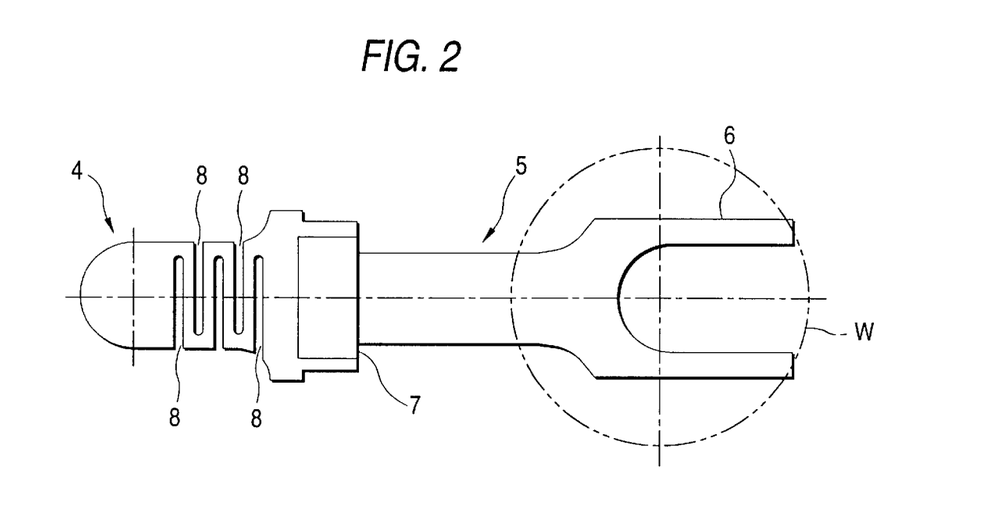
FIG. 2 is a plan view of a mounting member and an arm of a wafer transfer apparatus of a second embodiment of the invention.

FIG. 2 is a plan view of a mounting member and an arm of a wafer transfer apparatus of a second embodiment of the invention. In the embodiment, five cut-out grooves 8 which are thinner than those of the first embodiment are formed in a staggered manner between the tip end portion and the basal portion of the third arm 4. The portion among the cut-out grooves 8 is formed to be longer than that of the first embodiment, and hence heat is more naturally radiated in the portion among the cut-out grooves 8. Consequently, heat conduction from the film growth apparatus or the like to the first and second arms 2 and 3 and the driving mechanism 1 is suppressed. Also in the embodiment, the portion among the cut-out grooves 8 constitutes the heat conduction suppressing portion which suppresses conduction of heat.

Figure 3:
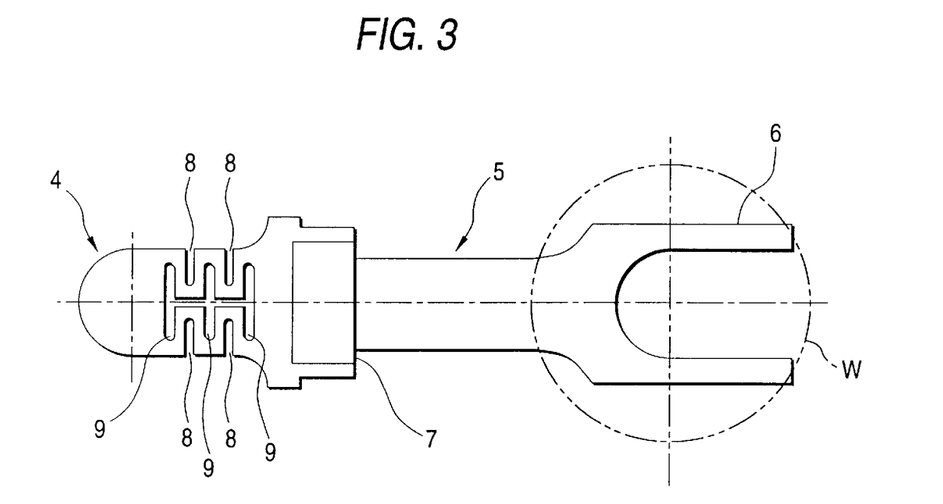
FIG. 3 is a plan view of a mounting member and an arm of a wafer transfer apparatus of a third embodiment of the invention.

FIG. 3 is a plan view of a mounting member and an arm of a wafer transfer apparatus of a third embodiment of the invention. In the embodiment, cut-out grooves 8 are formed in side end portions of the third arm 4, and cut-out grooves 9 are further formed in a center portion of the third arm 4. Therefore, the heat conduction path among the cut-out grooves 8 and 9 is formed to have a further larger length, so that heat is more naturally radiated in the portion. Consequently, heat conduction to the first and second arms 2 and 3 and the driving mechanism 1 is further suppressed. Also in the embodiment, the portion among the cut-out grooves 8 and 9 constitutes the heat conduction suppressing portion which suppresses conduction of heat.

Figure 4:
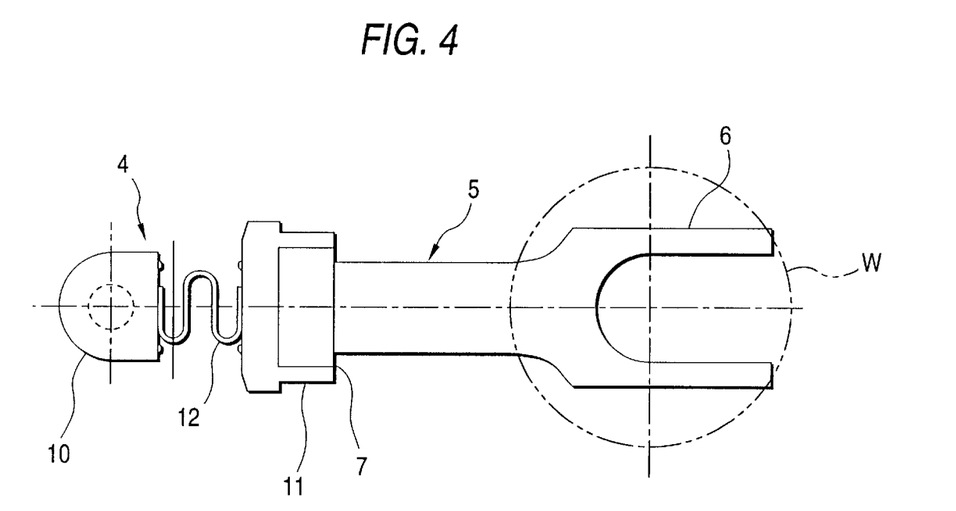
FIG. 4 is a plan view of a mounting member and an arm of a wafer transfer apparatus of a fourth embodiment of the invention.

FIG. 4 is a plan view of a mounting member and an arm of a wafer transfer apparatus of a fourth embodiment of the invention. In the embodiment, the third arm 4 is divided into a basal portion 10 and a tip end portion 11, and a thin plate member 12 made of stainless steel is interposed between the tip end portion 11 and the basal portion 10. The thin plate member has a low heat conductivity and is bent several times. The thin plate member 12 constitutes the heat conduction suppressing portion. The thin plate member 12 is made of stainless steel of a low heat conductivity, and bent several times to lengthen the heat conduction path. Consequently, heat conduction from the film growth apparatus or the like to the first and second arms 2 and 3 and the driving mechanism 1 is suppressed.

Figure 5:
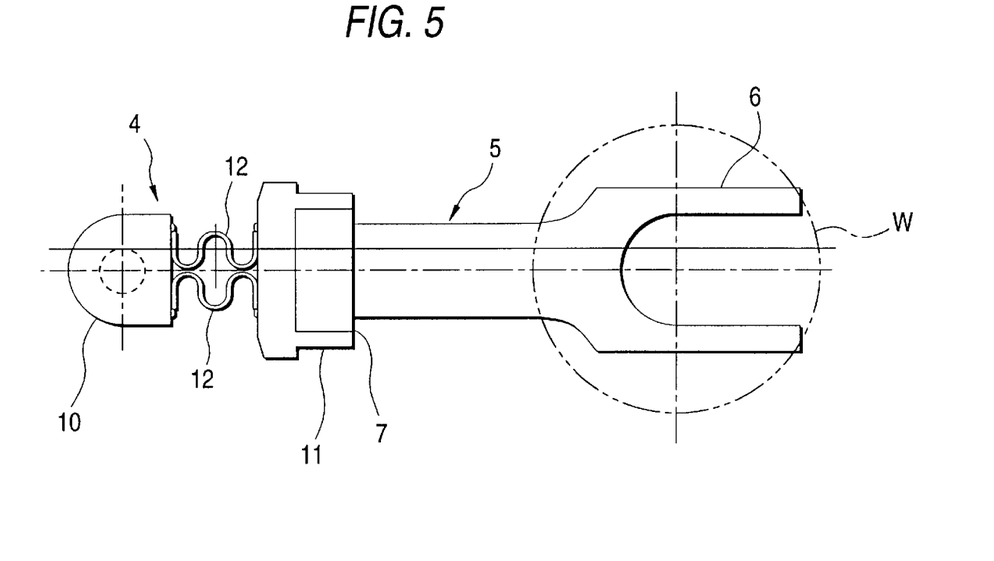
FIG. 5 is a plan view of a mounting member and an arm of a wafer transfer apparatus of a fifth embodiment of the invention.

FIG. 5 is a plan view of a mounting member and an arm of a wafer transfer apparatus of a fifth embodiment of the invention. In the embodiment, one pair of thin plate members 12 each of which is the same as the thin plate member 12 of the fourth embodiment are symmetrically disposed. The pair of thin plate members 12 are made of stainless steel of a low heat conductivity, and bent several times to lengthen the heat conduction path, whereby heat conduction to the first and second arms 2 and 3 and the driving mechanism is suppressed. Since the pair of thin plate members 12 are disposed in the embodiment, furthermore, the embodiment is greater in strength than the fourth embodiment.

Figure 6:
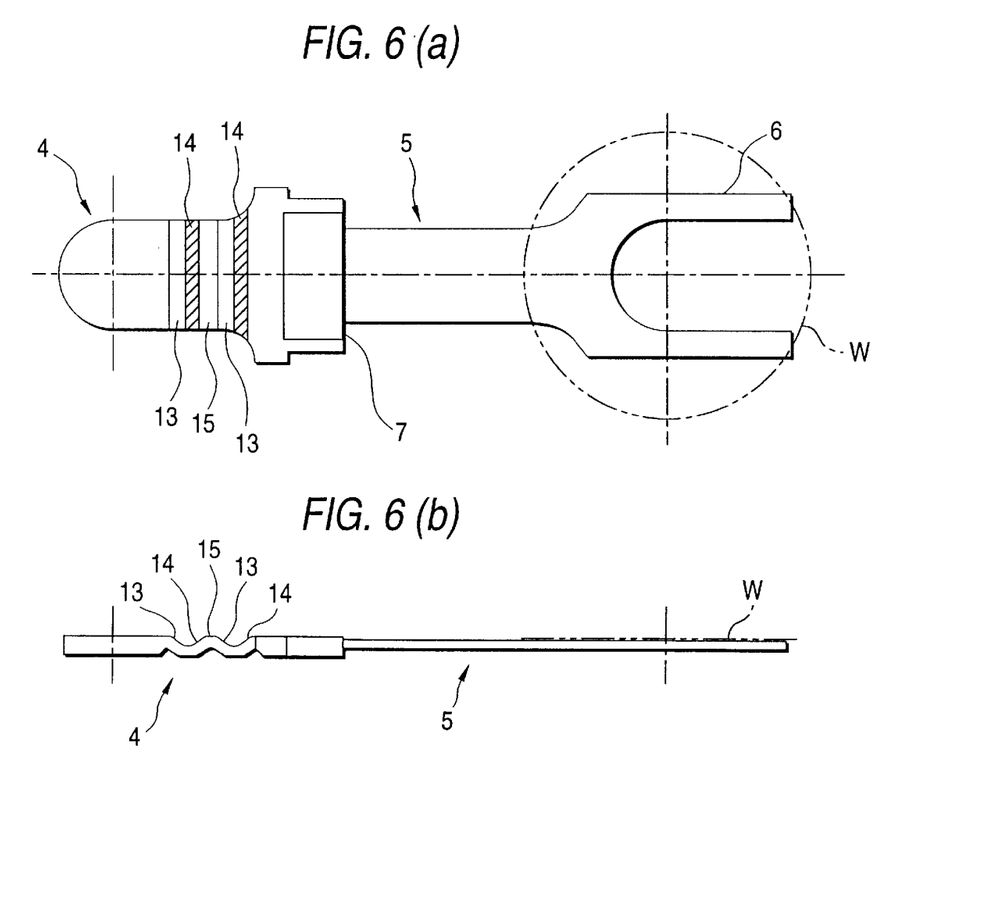
FIG. 6(a) is a plan view of a mounting member and an arm of a wafer transfer apparatus of a sixth embodiment of the invention.
FIG. 6(b) is a side view of the mounting member and the arm which are shown in FIG. 6(a)

FIG. 6(a) is a plan view of a mounting member and an arm of a wafer transfer apparatus of a sixth embodiment of the invention, and FIG. 6(b) is a side view of the mounting member and the arm which are shown in FIG. 6(a).

In the embodiment, inclined faces 13 which directly receive radiation heat from the film growth apparatus or the like, and inclined faces 14 which do not directly receive radiation heat from the side of the film growth apparatus or the like are formed between the tip end portion and the substrate portion of the third arm 4. The inclined faces 13, and a peak face 15 which is formed between the two kinds of inclined faces are mirror-finished/ground. The radiation heat from the film growth apparatus or the like is reflected by the inclined faces 13 and the peak face 15 which are mirror-finished/ground. The inclined faces 14 are black-colored by, for example, the REIDENTO process, so that heat is dissipated from the third arm 4. The inclined faces 13 and the peak face which are mirror-polished, and the inclined faces 14 which are black-colored constitute the heat conduction suppressing portion. The back face of the third arm 4 is configured in the same manner.

Figure 7:
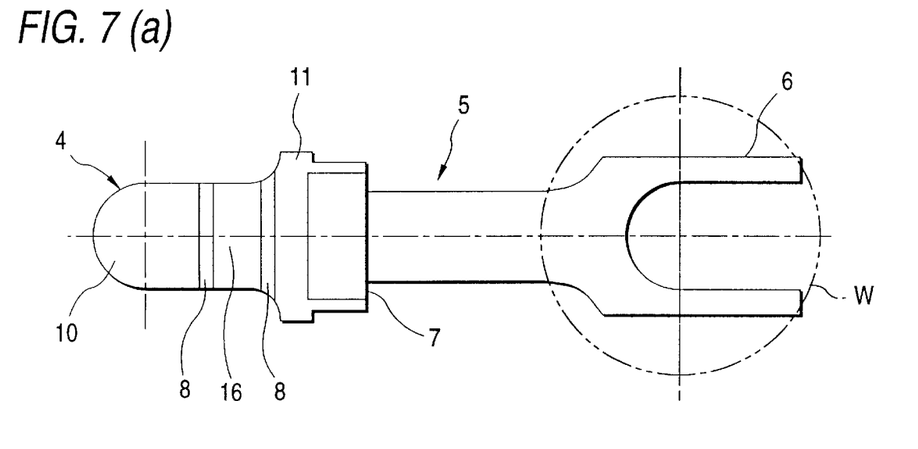
FIG. 7(a) is a plan view of a mounting member and an arm of a wafer transfer apparatus of a seventh embodiment of the invention.
FIG. 7(b) is a side view of the mounting member and the arm which are shown in FIG. 7(a)
FIG. 7(c) is an enlarged view of a part of FIG. 7(b)

FIG. 7(a) is a plan view of a mounting-member and an arm of a wafer transfer apparatus of a seventh embodiment of the invention, FIG. 7(b) is a side view of the mounting member and the arm which are shown in FIG. 7(a), and FIG. 7(c) is an enlarged view of a part of FIG. 7(b).

In the embodiment, the third arm 4 is divided into the basal portion 10 and the tip end portion 11. Thin-plate extension portions 10a and 11a which respectively protrude toward each other from the basal portion 10 and the tip end portion 11 are connected to each other by a thin plate member 18 made of stainless steel, while forming three grooves 8. A Teflon resin layer 16 is sandwiched between the thin plate member 18, and the thin-plate extension portions 10a and 11a. Therefore, heat conduction is suppressed by natural heat radiation due to the grooves 8, and also by the Teflon resin layers 16.

Note that Teflon means a fluorocarbon resins, particularly, poly(tetrafluoroethylene).

Figure 8A:
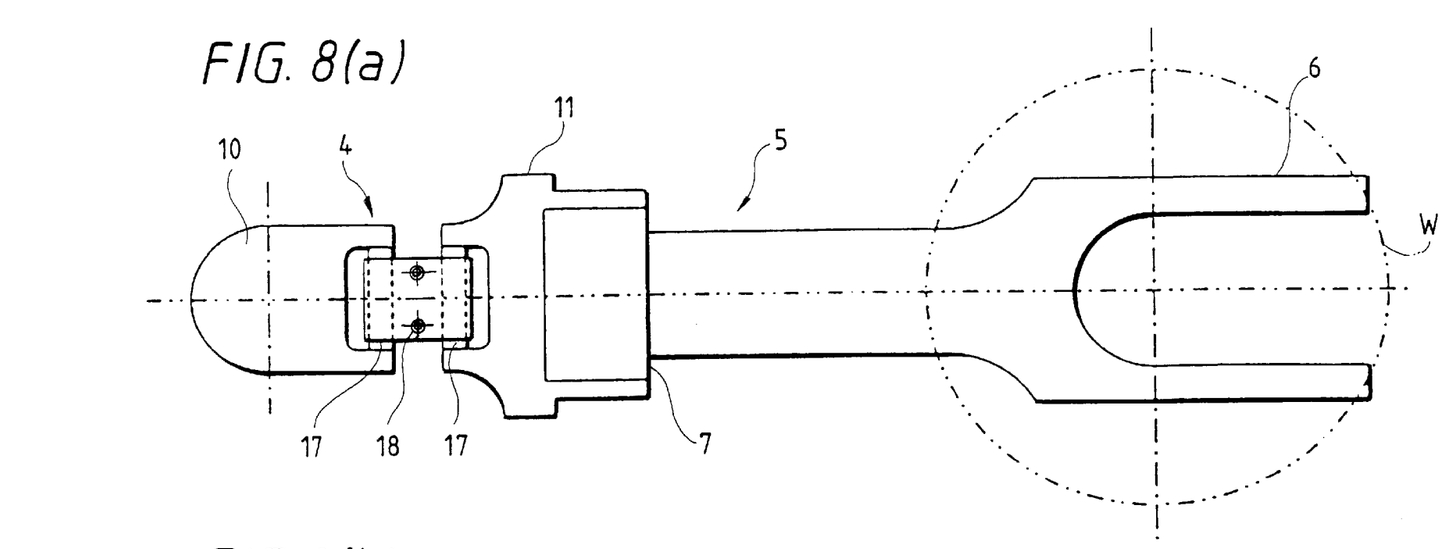
FIG. 8(a) is a plan view of a mounting member and an arm of a wafer transfer apparatus of an eighth embodiment of the invention.
Figure 8B:
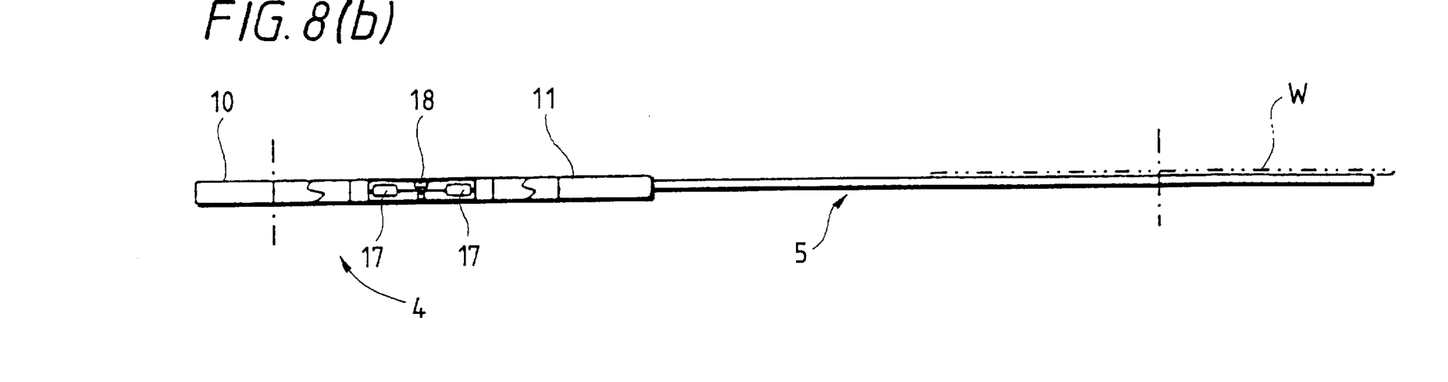
FIG. 8(b) is a side view of the mounting member and the arm which are shown in FIG. 8(a)

FIG. 8(a) is a plan view of a mounting member and an arm of a wafer transfer apparatus of an eighth embodiment of the invention, and FIG. 8(b) is a side view of the mounting member and the arm which are shown in FIG. 8(a).

In the embodiment, the third arm 4 is divided into the basal portion 10 and the tip end portion 11. A bridge member 17 which is coated by Teflon resin is disposed in each of the basal portion 10 and the tip end portion 11. The thin plate member 18 made of stainless steel is bridged between the bridge members 17. In this way, the bridge members 17 are coated by Teflon resin so that the heat conductivity is lowered, and the thin plate member 18 is made of stainless steel so that the heat conductivity is lowered. Therefore, heat conduction is suppressed by natural heat radiation. The bridge members 17 and the thin plate member 18 constitute the heat conduction suppressing portion.

Figure 9A:
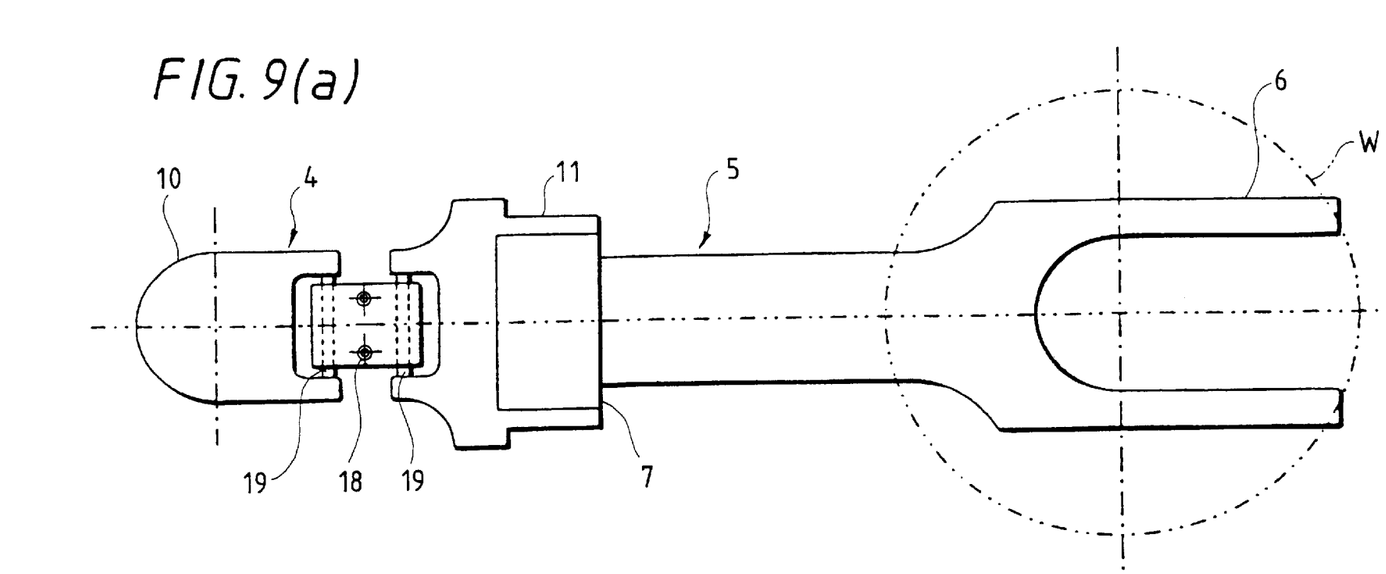
FIG. 9(a) is a plan view of a mounting member and an arm of a wafer transfer apparatus of a ninth embodiment of the invention.
Figure 9B:
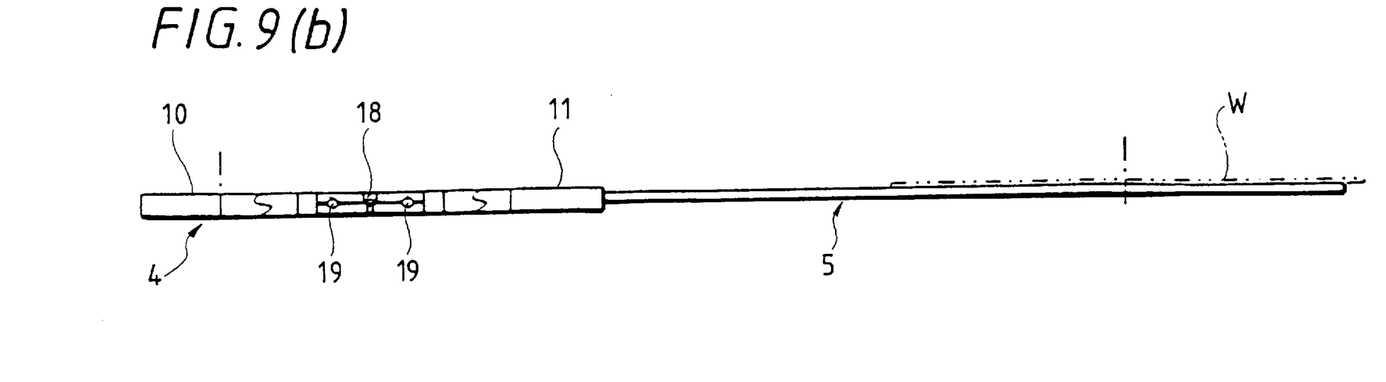
FIG. 9(b) is a side view of the mounting member and the arm which are shown in FIG. 9(a)

FIG. 9(a) is a plan view of a mounting member and an arm of a wafer transfer apparatus of a ninth embodiment of the invention, and FIG. 9(b) is a side view of the mounting member and the arm which are shown in FIG. 9(a).

In the embodiment, in the same manner as the eighth embodiment, the third arm 4 is divided into the basal portion 10 and the tip end portion 11, a bridge member 19 which is coated by Teflon resin is disposed in each of the basal portion 10 and the tip end portion 11, and the thin plate member 18 made of stainless steel is bridged between the bridge members 19, thereby suppressing heat conduction.

In the embodiment, the bridge members 19 are formed into a cylindrical shape. Therefore, the angle formed by the basal portion 10 and the tip end portion 11 of the third arm 4 can be changed. According to this configuration, the inclination angle and the vertical position of the third arm 4 can be adjusted.

Figure 10:
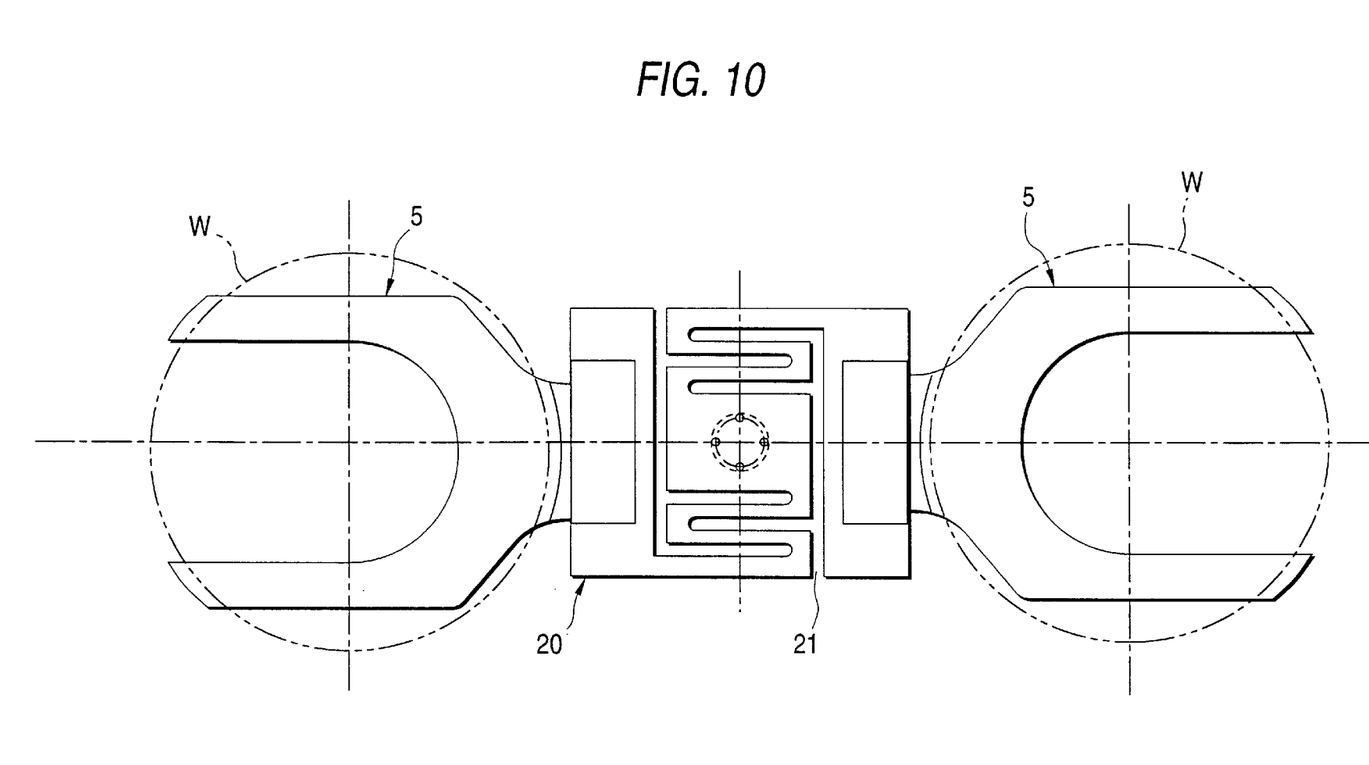
FIG. 10 is a plan view of a mounting member and an arm of a wafer transfer apparatus of a tenth embodiment of the invention.

FIG. 10 is a plan view of a mounting member and an arm of a wafer transfer apparatus of a tenth embodiment of the invention. In the embodiment, two end effectors 5 are disposed in order that two wafers W are simultaneously conveyed. The two end effectors 5 are fitted into a single arm 20. As shown in FIG. 10, cut-out grooves 21 are formed longitudinally and latitudinally in the arm 20. Unlike the first embodiment, particularly, the cut-out grooves 21 are formed also in the width direction of the arm 20. Even when heat is transmitted from the side of the end effectors 5, therefore, the heat is naturally radiated in the course of transmission of heat in the portion among the cut-out grooves 21. Consequently, heat conduction from the film growth apparatus or the like to the first and second arms 2 and 3 and the driving mechanism 1 is suppressed.

Next, an eleventh embodiment of the invention will be described with reference to FIG. 11 and the subsequent figures.

In the eleventh embodiment, the driving mechanism 1 and the first and second arms 2 and 3 are configured in the same manner as those of the prior art shown in FIG. 14 and-hence of the embodiments described above.

Moreover, also the configuration of the eleventh embodiment described below, in which a third arm 104 is rotatably connected to the second arm 3 and an end effector 105 is fitted into the third arm is similar to that of the prior art shown in FIG. 14 or of the embodiments described above.

The heat conduction suppressing portion of the third arm is configured in a different manner from that of the embodiments described above. That is, a low-temperature melting substance (for example, sodium or naphthalene) which melts at a temperature of about 120° C. or lower is enclosed in the third arm, so that, when heat from a wafer which is conveyed reaches the low-temperature melting substance, the heat is absorbed as the heat of melting, whereby heat conduction to the other arms and the driving mechanism is suppressed.

Figure 13A:
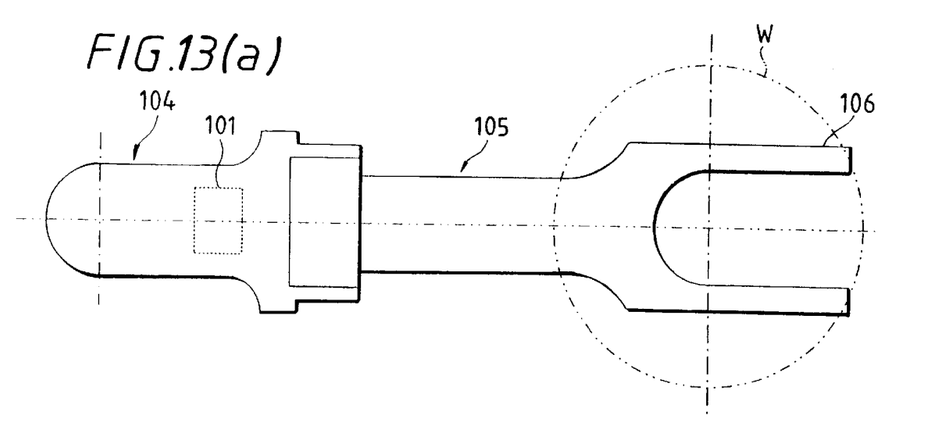
FIG. 13(a) is a plan view of a mounting member and an arm of the wafer transfer apparatus of the eleventh embodiment of the invention.
Figure 13B:
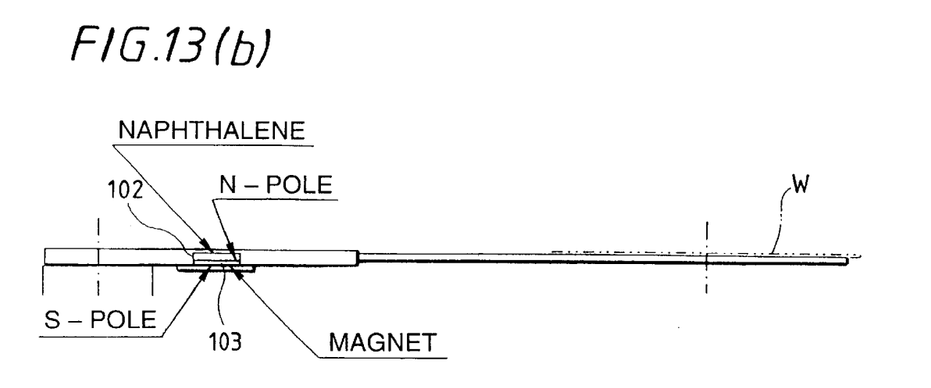
FIG. 13(b) is a view of the mounting member and the arm as seen from the front side.
Figure 13C:
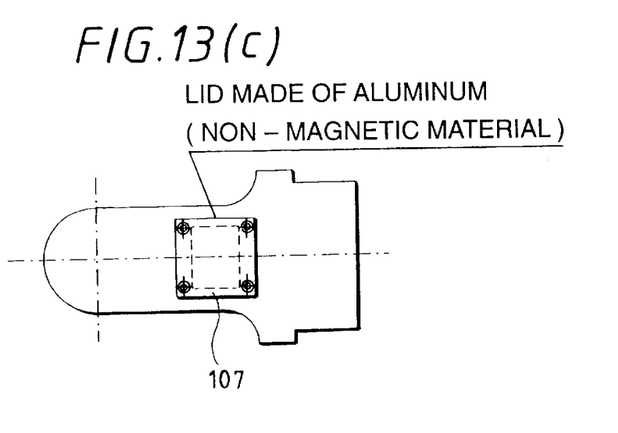
FIG. 13(c) is a bottom view of the arm.

As shown in FIG. 13, the outer shape of the third arm is identical with that of the third arm 4 of the prior art shown in FIGS. 14 and 15. In the third arm 104 of the embodiment, however, a chamber portion 101 of an adequate area is formed, and naphthalene 102 which is a low-temperature melting substance is filled into the chamber portion. Below the naphthalene 102, a lid 107 which is made of a non-magnetic material or aluminum is fixed to the lower face of the third arm 104 via a permanent magnet plate 103 so as to cover the whole of the chamber portion. In the embodiment, the permanent magnet plate 103 is directed so that the N-pole is in the upper side and the S-pole in the lower side. Alternatively, the direction of the permanent magnet plate may be inverted.

Figure 11:
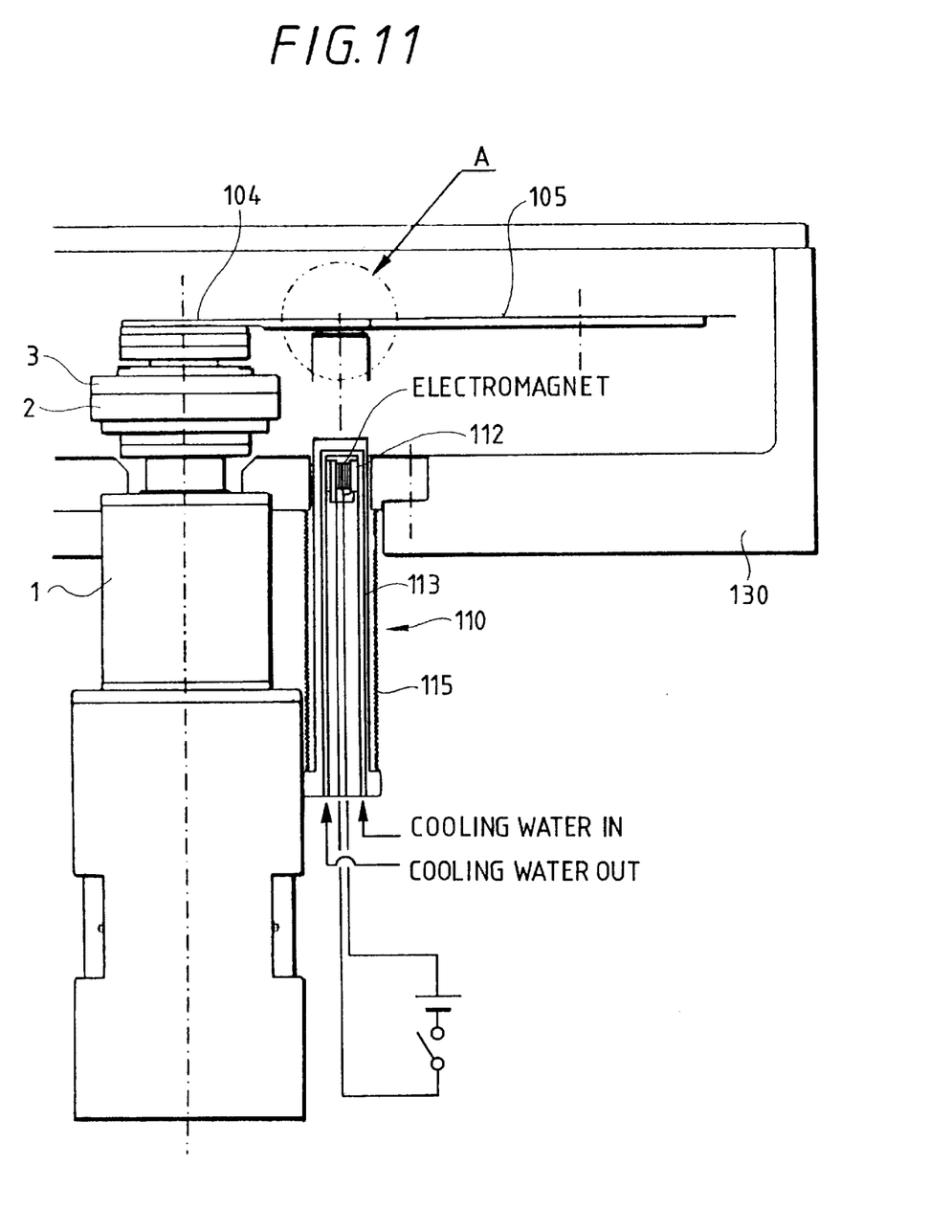
FIG. 11 is a view of a wafer transfer apparatus of an eleventh embodiment of the invention as seen from the front side.

As shown in FIG. 11, a cooling device 110 is disposed below the third arm 104 so as to be vertically movable. The cooling device 110 has a magnetic fluid portion 102 at its upper end. The magnetic fluid portion extends over an area which is substantially equal to that of the chamber portion 101 of the third arm 104. At the elevated position of the cooling device, the magnetic fluid portion 102 is proximately opposed to the chamber portion 101 of the third arm 104.

The cooling device 110 has an electromagnet 112 in the vicinity of the magnetic fluid portion 102 at the upper end, and also a cooling water pipe 113 which passes a position in proximity to the magnetic fluid portion 102, so that cooling water can circulate therethrough.

Figure 12A:
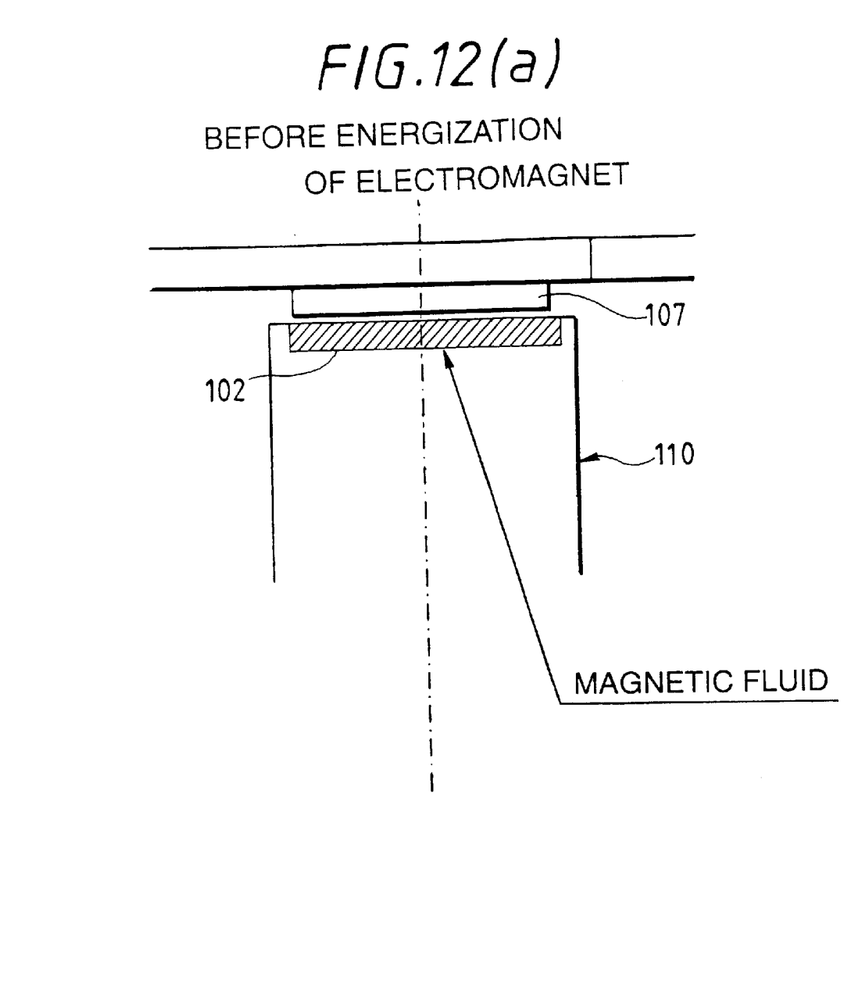
Figure 12B:
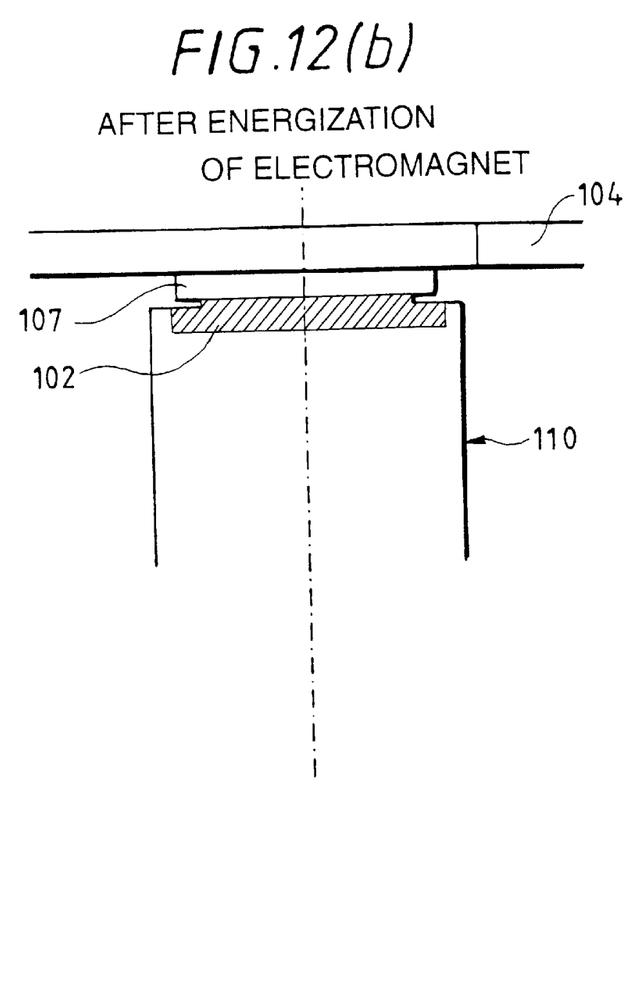

FIG. 12 is an enlarged view of the portion A of FIG. 11 and showing the upper end portion of the cooling device 110 which is at the elevated position. In FIG. 12, (a) shows the state before the electromagnet is energized, and (b) the state after the electromagnet is energized.

The thus structured cooling device 110 is surrounded by a bellows 115, and connected to a transfer chamber 130.

In the eleventh embodiment, when the cooling device 110 is elevated by an elevating device which is not shown and the electromagnet 112 is energized so that the N-pole is formed in the upper side, the magnetic fluid portion 102 is attracted to the chamber 101 as shown in FIG. 12(b), and hence heat accumulated in the low-temperature melting substance such as naphthalene is absorbed. The absorbed heat is further absorbed by the cooling water circulating through the cooling water pipe 113, and then discharged to the outside. When the electromagnet 112 is then energized in the reverse direction, the cooling device can be separated from the third arm without causing the magnetic fluid to be scattered.

The invention is not restricted to the embodiments described above, and may be variously modified. Particularly, the article which is to be transferred by the transfer apparatus is not limited to a semiconductor wafer, and may include various kinds of substrates such as an LCD substrate.

Furthermore, the apparatus of the invention can be used in either of an atmospheric space, a reduced pressure space, and an evacuated space.

As described above, according to the invention, a heat conduction suppressing portion which suppresses conduction of heat is disposed between the end portion of the front end arm coupled to the mounting member, and the basal portion of the front end arm. Even when the mounting member for a substrate is exposed to a relatively high temperature of a film growth apparatus or the like, therefore, heat conduction to another arm of the transfer apparatus, the driving mechanism, and the like is suppressed, and an influence of heat from a film growth apparatus or the like is reduced. Therefore, a magnetic fluid used in the transfer apparatus is less changed in quality, and deterioration of the sealing performance of the magnetic fluid seal is reduced. Furthermore, grease or a belt in the transfer apparatus is less changed in quality or deformed, so that the life period of the grease or the belt is prolonged, whereby the number of maintenance works can be reduced. Moreover, heat of a high temperature is hardly transmitted also to a metal part of the transfer apparatus, and hence the metal part is thermally expanded in a reduced degree, so that the accuracy of the part is stabilized. Therefore, a substrate such as a semiconductor wafer can be accurately transferred for a long term while suppressing an influence of heat from the film growth apparatus or the like, to a level as low as possible.

The present invention is based on Japanese Patent Application No. Hei. 9-367642, which is incorprated herein by reference.

While there has been described in connection with the preferred embodiment of the invention, it will be obvious to those skilled in the art that various changes and modifications may be made therein without departing from the invention, and it is aimed, therefore, to cover in the appended claim all such changes and modifications as fall within the true spirit and scope of the invention.

What is claimed is:

1. A substrate transfer apparatus comprising:
   a driving mechanism;
   a plurality of arms rotatably coupled in sequence to said driving mechanism, said arms including a first arm which comprises a heat conduction suppressing portion disposed between a tip end portion and a basal portion thereof, wherein said heat conduction suppressing portion comprises at least one of:
   (i) a heat conduction path which is elongated into a meandering shape without increasing a length of said first arm in a longitudinal direction thereof,
   (ii) an interposed member which is interposed between a tip end portion and a basal portion and is made of a low heat conductive material,
   (iii) a first inclined portion and a second inclined portion which are connected to each other and define a zigzag-shaped cross-section, wherein said first inclined portion has a mirror-polished surface, and said second inclined portion has a black-colored surface, and
   (iv) a portion in which a low temperature melting substance is enclosed; and
   a placing member coupled to said first arm for placing a substrate thereon.

2. The substrate transfer apparatus according to claim 1, in which said heat conduction suppressing portion is formed by a plurality of cut-out grooves.

3. The substrate transfer apparatus according to claim 2, in which said plurality of cut-out grooves are respectively extended from side edges of said first arm.

4. The substrate transfer apparatus according to claim 3, in which said plurality of cut-out grooves which are arranged in a staggered manner.

5. The substrate transfer apparatus according to claim 3, in which said plurality of cut-out grooves are aligned in a line extending in a direction perpendicular to a longitudinal direction of said first arm.

6. The substrate transfer apparatus according to claim 3, in which said plurality of cut-out grooves comprises a first groove extending in a longituidinal direction of said first arm and a second groove connecting to said first groove, said second groove being extended in a direction perpendicular to said longitudinal direction.

7. The substrate transfer apparatus according to claim 1, in which said heat conduction suppressing portion is formed by a stainless steel plate.

8. The substrate transfer apparatus according to claim 7, in which said stainless steel plate has a wave-shaped cross section.

9. The substrate transfer apparatus according to claim 7, in which said stainless steel plate comprises a pair of stainless steel members each having a wave-shaped cross section.

10. The substrate transfer apparatus according to claim 1, in which said first arm comprises:
    a first extension protruded from said basal portion;
    a second extension protruded from said tip end portion; and
    a stainless steel plate one end of which is connected with said first extension through a Fluorocarbon resin layer and the other end of which is connected with said second extension through a Fluorocarbon resin layer.

11. The substrate transfer apparatus according to claim 1, in which said first arm comprises:
    a first bridge-shaped extension connected to said basal portion in a bridge-shaped manner and coated by Fluorocarbon resin;
    a second bridge-shaped extension connected to said tip end portion in a bridge-shaped manner and coated by Fluorocarbon resin; and
    a stainless steel plate one end of which is connected with said first extension and the other end of which is connected with said second extension.

12. The substrate transfer apparatus according to claim 11, in which each of said first and second bridge-shaped extension has a circular cross-section.

13. The substrate transfer apparatus according to claim 11, in which each of said first and second bridge-shaped extension has a rectangular cross-section.

14. The substrate transfer apparatus according to claim 1, wherein
    said first arm further comprises an opposite tip end portion in which said tip end portion and said opposite tip end portion are located on opposite ends of said first arm;
    said placing member comprises first and second placing elements for placing two substrates thereon respectively, said first placing element being coupled with said tip end portion and said second placing element being coupled with said opposite tip end portion;

said plurality of arms further comprises a second arm which is rotatably connected to the basal portion of said first arm; and said heat conduction suppressing portion comprises a first heat conduction suppressing part disposed between said tip end portion and said basal portion and a second heat conduction suppressing part disposed between said opposite tip end portion and said basal portion of said first arm.

15. The substrate transfer apparatus according to claim 1, further comprising:

a cooling device disposed below said first arm, in which said heat conduction suppressing portion comprises a low-temperature melting substance enclosed in said first arm, and a permanent magnet disposed adjacent to said low-temperature melting substance, wherein said low-temperature melting substance is cooled by said cooling device.

16. The substrate transfer apparatus according to claim 15, in which said low-temperature melting substance is selected from the group consisting of:

sodium and naphthalene.

\* \* \* \* \*